(12) United States Patent
Fukudome et al.

(10) Patent No.: US 12,155,379 B2
(45) Date of Patent: Nov. 26, 2024

(54) SEMICONDUCTOR DEVICE DRIVE CIRCUIT

(71) Applicant: Mitsubishi Electric Corporation, Tokyo (JP)

(72) Inventors: Jun Fukudome, Tokyo (JP); Kazuya Hokazono, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 27 days.

(21) Appl. No.: 18/315,638

(22) Filed: May 11, 2023

(65) Prior Publication Data

US 2024/0072791 A1 Feb. 29, 2024

(30) Foreign Application Priority Data

Aug. 17, 2022 (JP) .................................. 2022-129872

(51) Int. Cl.
    *H03K 17/16* (2006.01)
(52) U.S. Cl.
    CPC .................................. *H03K 17/168* (2013.01)
(58) Field of Classification Search
    CPC .................................................... H03K 17/168
    USPC ........................................................ 327/109
    See application file for complete search history.

(56) References Cited

U.S. PATENT DOCUMENTS

2015/0358019 A1* 12/2015 Wasekura ................ H03K 5/12
                                                    327/537

FOREIGN PATENT DOCUMENTS

| JP | 2008-193717 A | 8/2008 |
| JP | 2015-231117 A | 12/2015 |
| JP | 2020-061595 A | 4/2020 |

* cited by examiner

*Primary Examiner* — Tomi Skibinski
(74) *Attorney, Agent, or Firm* — Studebaker & Brackett PC

(57) ABSTRACT

A semiconductor device drive circuit includes: a first transistor and a second transistor operating complementarily between a first voltage and a second voltage lower than the first voltage; an internal power supply circuit operating between the first voltage and the second voltage, and including: a constant voltage generation unit outputting an internal power supply voltage steadily being a constant voltage; and a feedback unit receiving a node voltage of a connection node between the first transistor and the second transistor, and changing the internal power supply voltage output from the constant voltage generation unit in response to a change of the node voltage; and a pre-driver operating between the first voltage and the internal power supply voltage, and driving the first transistor or the second transistor, wherein the node voltage is output as a gate voltage of the power switching device.

6 Claims, 12 Drawing Sheets

F I G. 1
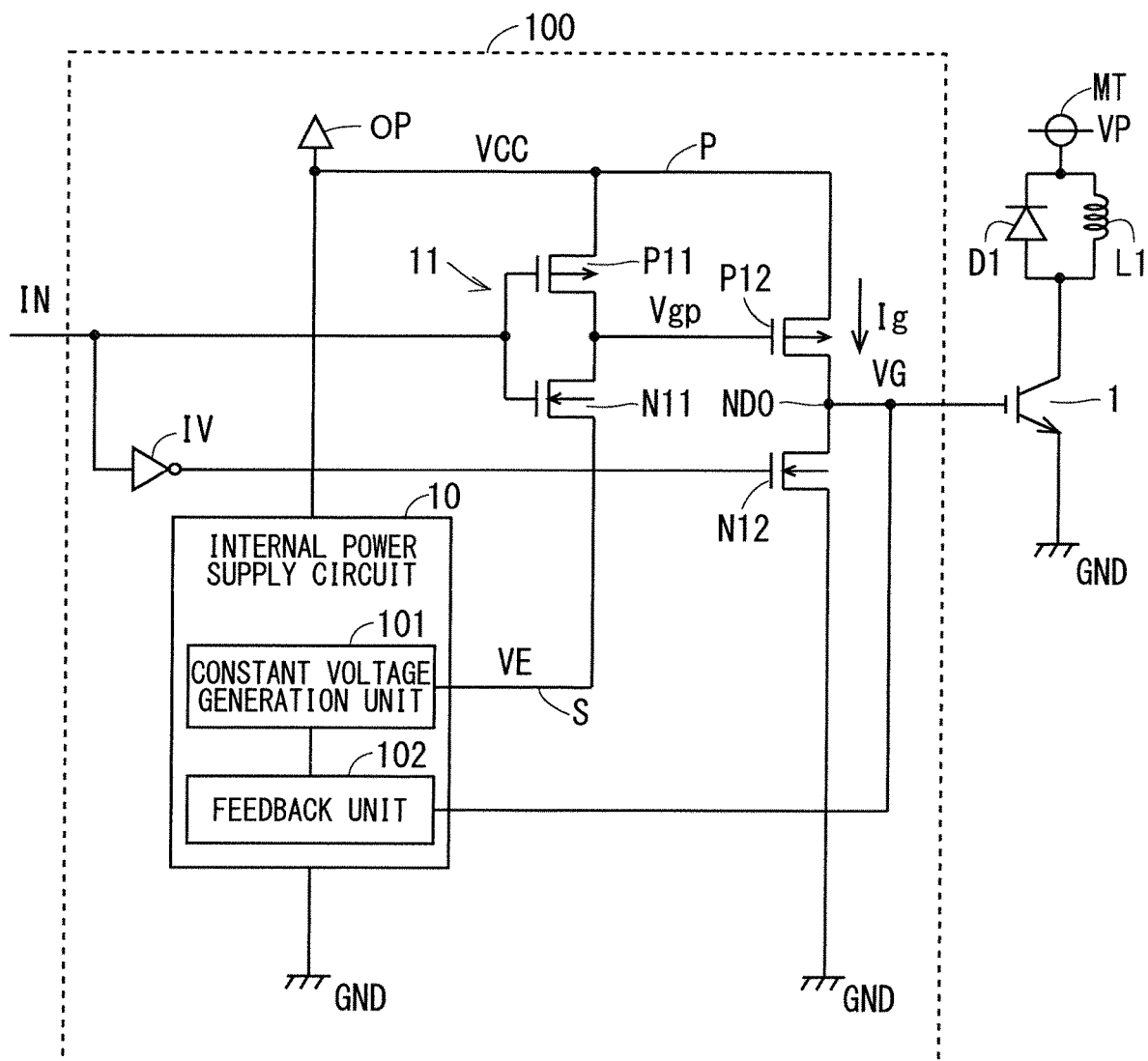

F I G. 7
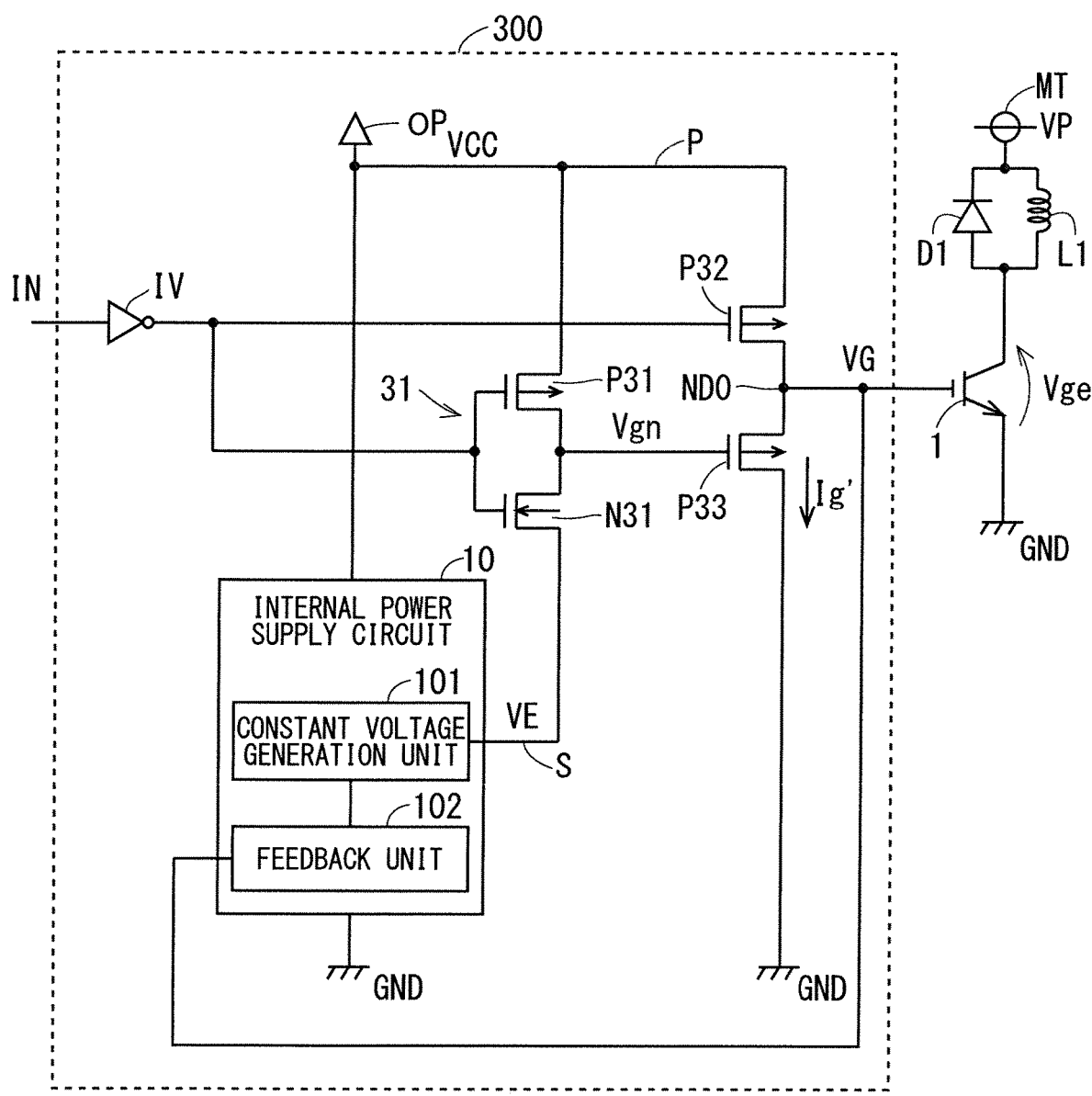

SEMICONDUCTOR DEVICE DRIVE CIRCUIT

BACKGROUND OF THE INVENTION

Field of the Invention

The present disclosure relates to a semiconductor device drive circuit, and relates to a semiconductor device drive circuit that drives a power switching device.

Description of the Background Art

In driving a power switching device, such as an insulated gate bipolar transistor (IGBT), it has been found useful to change an output current of a drive circuit during switching to improve switching characteristics, such as switching losses and noise. One approach includes a method of changing a gate voltage of a driver transistor, that is, an output voltage of a pre-driver in response to an output voltage.

For example, Japanese Patent Application Laid-Open No. 2015-231117 discloses a pre-driver that monitors an output current of an output transistor controlled by the pre-driver, and transitions an output voltage of the pre-driver between a low potential (L) and a high potential (H) at any timing in response to the output current.

When control is performed to transition an output of the pre-driver between L and H as disclosed in Japanese Patent Application Laid-Open No. 2015-231117, the output current of the output transistor greatly changes when the output of the pre-driver is L and when the output of the pre-driver is H, so that unnecessary operation is often performed, and switching losses of a power switching device might increase due to misalignment of a switching timing.

SUMMARY

It is an object of the present disclosure to provide a semiconductor device drive circuit that enables improvement in switching losses of a power switching device.

A semiconductor device drive circuit according to the present disclosure is a semiconductor device drive circuit that drives a power switching device, and includes: a first transistor and a second transistor that are connected in series and operate complementarily between a first voltage and a second voltage lower than the first voltage; an internal power supply circuit that operates between the first voltage and the second voltage, and includes: a constant voltage generation unit that outputs an internal power supply voltage steadily being a constant voltage; and a feedback unit that receives a node voltage of a connection node between the first transistor and the second transistor, and changes the internal power supply voltage output from the constant voltage generation unit in response to a change of the node voltage; and a pre-driver that operates between the first voltage and the internal power supply voltage, and drives the first transistor or the second transistor, wherein the node voltage is output as a gate voltage of the power switching device.

According to the semiconductor device drive circuit according to the present disclosure, an output current of the first transistor or the second transistor as an output transistor is changed during switching of the power switching device to improve switching losses of the power switching device.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a circuit diagram showing a configuration of a semiconductor device drive circuit in Embodiment 1 according to the present disclosure;

FIG. 7 is a circuit diagram showing a configuration of a semiconductor device drive circuit in Embodiment 3 according to the present disclosure;

DESCRIPTION OF THE PREFERRED EMBODIMENTS

Embodiment 1

Figure 2:
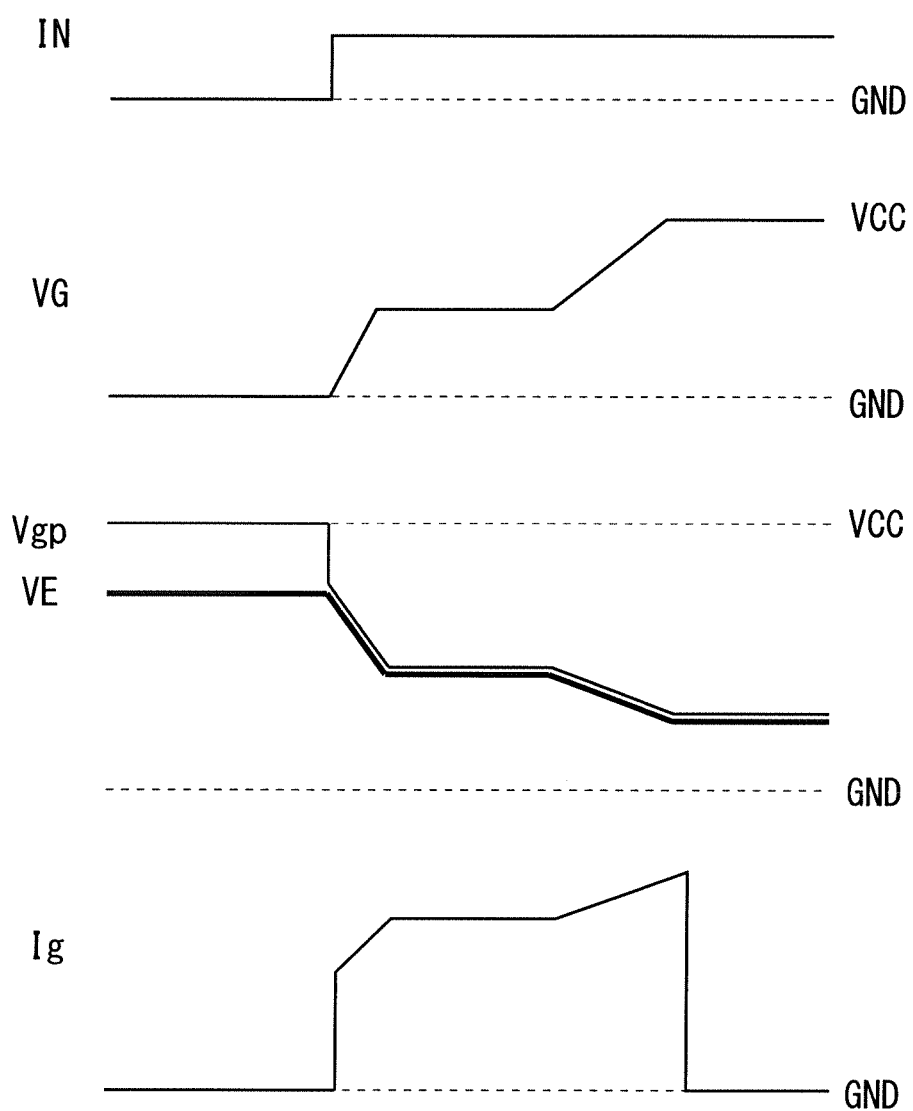
FIG. 2 is a diagram for describing operation of the semiconductor device drive circuit in Embodiment 1 according to the present disclosure.

FIG. 1 is a circuit diagram showing a configuration of a semiconductor device drive circuit 100 in Embodiment 1 according to the present disclosure. As shown in FIG. 1, the semiconductor device drive circuit 100 is configured as an integrated circuit (IC) that drives an IGBT 1 as a power device. A collector of the IGBT 1 is connected to a main terminal MT that provides a main voltage VP via a freewheeling diode D1 and an inductor load L1 connected in parallel, and an emitter of the IGBT 1 is connected to a ground potential GND.

The semiconductor device drive circuit 100 includes a P-channel type MOS transistor P12 as a source side output transistor and an N-channel type MOS transistor N12 as a sink side output transistor connected in series between a power supply line P supplied with a voltage VCC (first voltage) from a power supply terminal OP and a ground potential GND (second voltage).

The MOS transistors P12 and N12 operate complementarily, and a connection node ND0 between the MOS transistor P12 and the MOS transistor N12 serves as an output node ND0 of the semiconductor device drive circuit 100 from which a gate voltage VG is output and input into a gate of the IGBT 1.

An output voltage Vgp of a pre-driver 11 is input into a gate of the MOS transistor P12. The pre-driver 11 includes a P-channel type MOS transistor P11 and an N-channel type MOS transistor N11 connected in series between the power supply line P and an output line S of an internal power supply circuit 10.

The internal power supply circuit 10 is a circuit that operates between the voltage VCC and the ground potential GND, and includes a constant voltage generation unit 101 that outputs an internal power supply voltage VE steadily being a constant voltage, and a feedback unit 102 that receives the gate voltage VG, and changes the internal power supply voltage VE output from the constant voltage generation unit 101 in response to a change of the gate voltage VG. A source of the MOS transistor N11 is connected to the output line S.

Gates of the MOS transistor P11 and the MOS transistor N11 are commonly connected, and supplied with an input signal IN. The input signal IN is also supplied to an inverter IV, and an output of the inverter IV is input into a gate of the MOS transistor N12.

FIG. 2 is a diagram showing a plurality of signal waveforms for describing operation of the semiconductor device drive circuit 100. In FIG. 2, a waveform diagram of the input signal IN, a waveform diagram of the gate voltage VG, a waveform diagram of the output voltage Vgp of the pre-driver 11, a waveform diagram of the internal power supply voltage VE of the internal power supply circuit 10, and a waveform diagram of an output source current Ig of the MOS transistor P12 are shown in order from top.

When the input signal IN is switched from a low level to a high level, the MOS transistor P11 is turned off and the MOS transistor N11 is turned on in the pre-driver 11, and the output voltage Vgp of the pre-driver 11 transitions from the voltage VCC to the internal power supply voltage VE of the internal power supply circuit 10.

The MOS transistor P12 is thus turned on to increase the gate voltage VG, the internal power supply voltage VE decreases accordingly, and the output voltage Vgp decreases to follow the internal power supply voltage VE. A gate-to-source voltage of the MOS transistor P12 thus increases, so that the output source current Ig of the MOS transistor P12 increases.

The gate voltage VG has a waveform that increases from zero volts, increases again after a period of a constant voltage referred to as a mirror period, and eventually becomes constant at the voltage VCC. The mirror period corresponds to a period during which a gate-to-collector capacitance of the IGBT 1 is charged. The gate-to-collector capacitance is required to be charged to turn on the IGBT 1, and a period for the charge is the mirror period.

As described above, the semiconductor device drive circuit 100 outputs the gate voltage VG exhibiting the waveform that increases from zero volts, and becomes constant at the voltage VCC after the mirror period, and the internal power supply circuit 10 is configured to receive the gate voltage VG, and change the current flowing therethrough in an analog fashion, so that the output voltage Vgp of the pre-driver 11 that operates between the internal power supply voltage VE of the internal power supply circuit 10 and the voltage VCC can be changed continuously as shown in FIG. 2.

Thus, as shown in FIG. 2, the output source current Ig can be increased in entering the mirror period compared with that at the start of switching, and the amount of current can be maintained during the mirror period. This is because the internal power supply voltage VE of the internal power supply circuit 10 decreases with the increase of the gate voltage VG, and thus the gate-to-source voltage of the MOS transistor P12 increases.

The increase of the output source current Ig during the mirror period allows for acceleration of a gate charge rate of the IGBT 1 and shortening of the mirror period.

A collector-to-emitter decrease rate dV/dt of the IGBT 1 can thus become steep, and switching losses can be improved.

Figure 3:
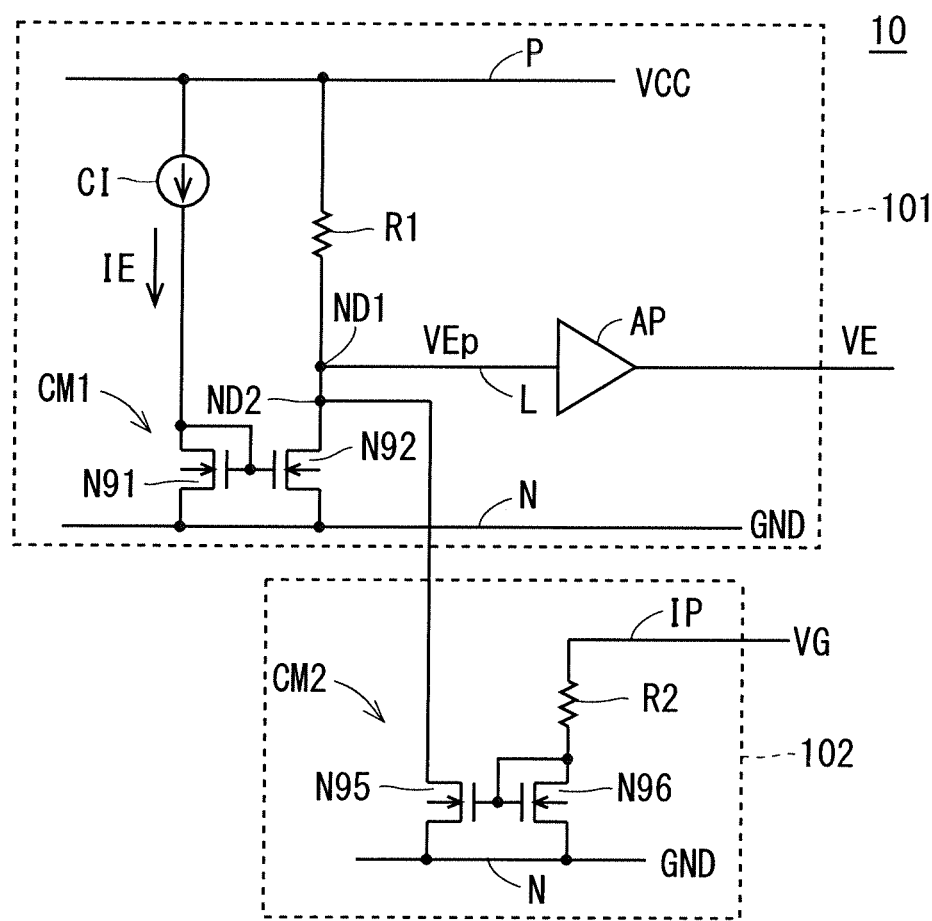
FIG. 3 is a circuit diagram showing one example of a configuration of an internal power supply circuit.

FIG. 3 is a circuit diagram showing one example of a configuration of the internal power supply circuit 10. As shown in FIG. 3, the internal power supply circuit 10 includes a current mirror circuit CM1 (first current mirror circuit) including a primary side circuit in which a constant current source CI and an N-channel type MOS transistor N91 are connected in series between the power supply line P (a first power supply line) that provides the voltage VCC and a power supply line N (second power supply line) that provides the ground potential GND and a secondary side circuit in which a resistive element R1 (first resistive element) and an N-channel type MOS transistor N92 are connected in series between the power supply line P and the power supply line N. Gates of the MOS transistor N91 and the MOS transistor N92 are commonly connected to a drain of the MOS transistor N91. A node ND1 between the MOS transistor N92 and the resistive element R1 is connected to an input of an amplifier AP via a signal line L. The constant voltage generation unit 101 is configured by the above-mentioned circuit.

The internal power supply circuit 10 includes a current mirror circuit CM2 (second current mirror circuit) including a primary side circuit in which an N-channel type MOS transistor N95 is connected between a node ND2 between the MOS transistor N92 and the resistive element R1 and the power supply line N and a secondary side circuit in which a resistive element R2 (second resistive element) and an N-channel type MOS transistor N96 are connected between an input IP of the internal power supply circuit 10 and the power supply line N. Gates of the MOS transistor N95 and the MOS transistor N96 are commonly connected to a drain of the MOS transistor N96. The feedback unit 102 is configured by the above-mentioned circuit.

The current mirror circuit CM1 allows a current depending on a current IE output from the constant current source CI to flow through the MOS transistor N92. The current flows through the resistive element R1 to generate a voltage VEp, and the internal power supply voltage VE is output by using the amplifier AP as a follower circuit.

The current mirror circuit CM2 allows a current depending on a value of the gate voltage VG input into the input IP to flow through the MOS transistor N95. When the gate voltage VG increases from zero, a current flowing through the resistive element R2 increases with the increase of the gate voltage VG, and the current flowing through the resistive element R1 increases accordingly, so that the voltage VEp decreases, and the internal power supply voltage VE output from the amplifier AP decreases.

Embodiment 2

Figure 4:
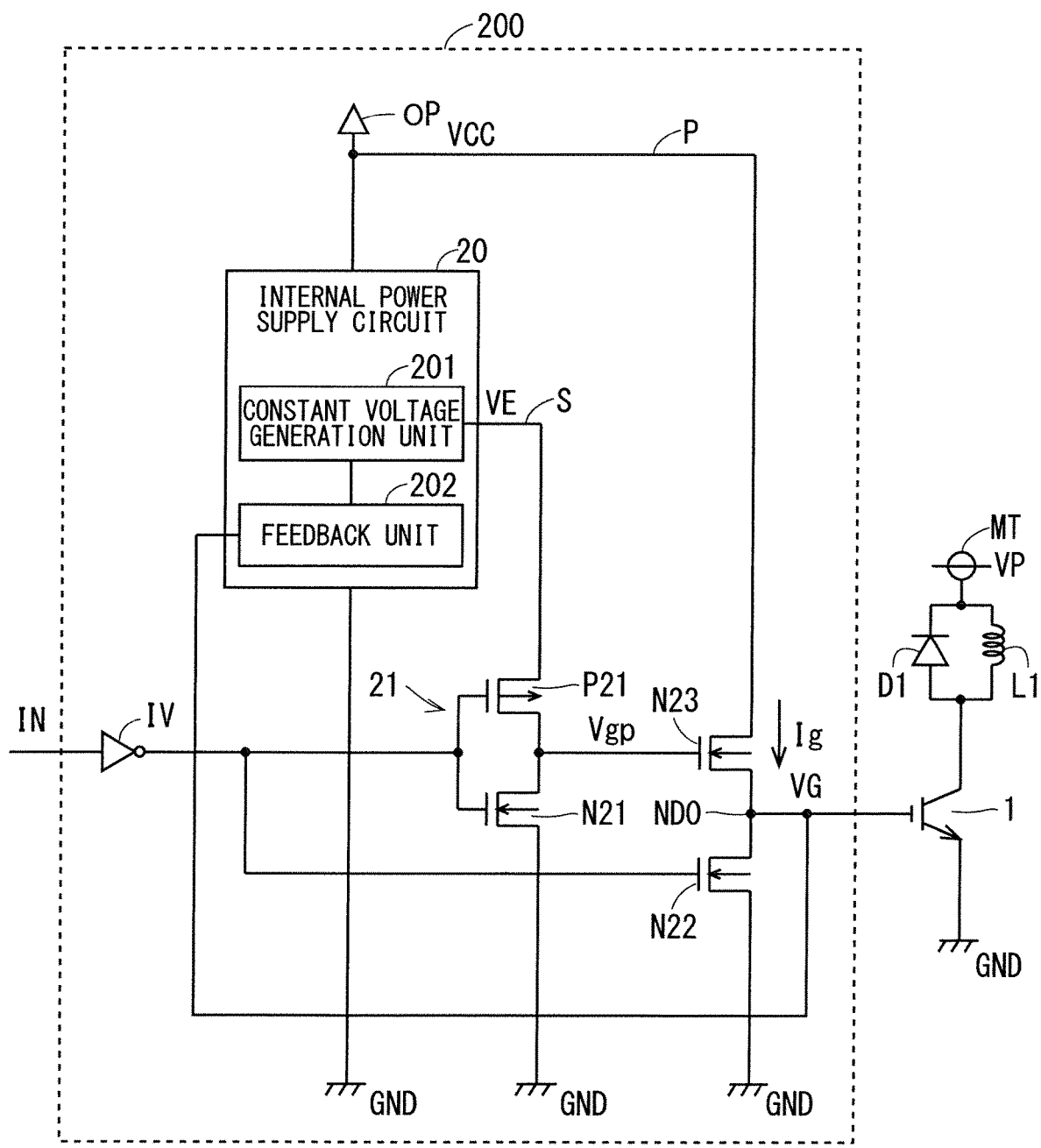
FIG. 4 is a circuit diagram showing a configuration of a semiconductor device drive circuit in Embodiment 2 according to the present disclosure.

FIG. 4 is a circuit diagram showing a configuration of a semiconductor device drive circuit 200 in Embodiment 2 according to the present disclosure. As shown in FIG. 4, the semiconductor device drive circuit 200 is configured as the IC that drives the IGBT 1 as the power device. The collector of the IGBT 1 is connected to the main terminal MT that provides the main voltage VP via the freewheeling diode D1 and the inductor load L1 connected in parallel, and the emitter of the IGBT 1 is connected to the ground potential GND.

The semiconductor device drive circuit 200 includes an N-channel type MOS transistor N23 as the source side output transistor and an N-channel type MOS transistor N22 as the sink side output transistor connected in series between the power supply line P supplied with the voltage VCC from the power supply terminal OP and the ground potential GND.

The MOS transistors N23 and N22 operate complementarily, and a connection node ND0 between the MOS transistor N23 and the MOS transistor N22 serves as an output node ND0 of the semiconductor device drive circuit 200 from which the gate voltage VG is output and input into the gate of the IGBT 1.

An output voltage Vgp of a pre-driver 21 is input into a gate of the MOS transistor N23. The pre-driver 21 includes a P-channel type MOS transistor P21 and an N-channel type MOS transistor N21 connected in series between an output line S of an internal power supply circuit 20 and the ground potential GND.

The internal power supply circuit 20 is a circuit that operates between the voltage VCC and the ground potential GND, and includes a constant voltage generation unit 201 that outputs the internal power supply voltage VE steadily being a constant voltage, and a feedback unit 202 that receives the gate voltage VG, and changes the internal power supply voltage VE output from the constant voltage generation unit 201 in response to the change of the gate voltage VG. A source of the MOS transistor P21 is connected to the output line S.

Gates of the MOS transistor P21 and the MOS transistor N21 are commonly connected to the output of the inverter IV. The inverter IV is supplied with the input signal IN, and the output of the inverter IV is also input into a gate of the MOS transistor N22.

Figure 5:
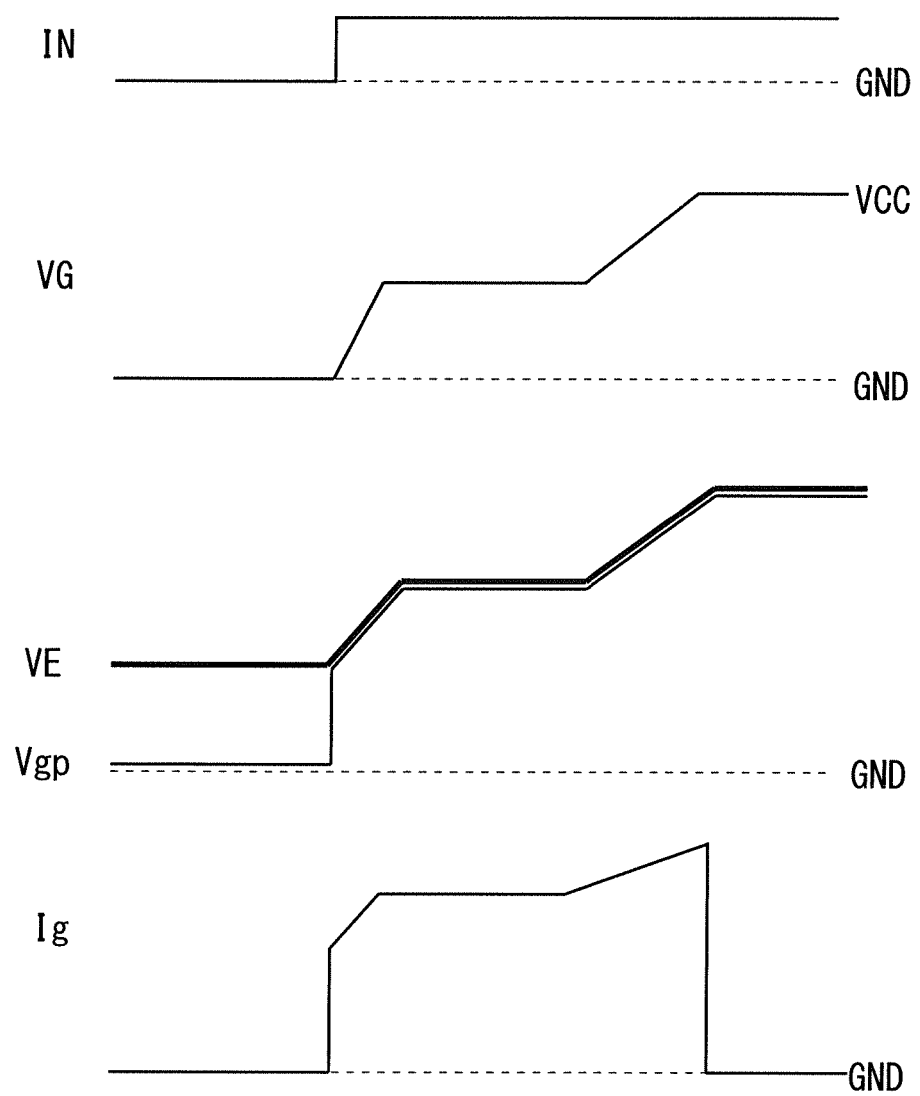
FIG. 5 is a diagram for describing operation of the semiconductor device drive circuit in Embodiment 2 according to the present disclosure.

FIG. 5 is a diagram showing a plurality of signal waveforms for describing operation of the semiconductor device drive circuit 200. In FIG. 5, the waveform diagram of the input signal IN, the waveform diagram of the gate voltage VG, a waveform diagram of the internal power supply voltage VE of the internal power supply circuit 20, a waveform diagram of the output voltage Vgp of the pre-driver 21, and a waveform diagram of the output source current Ig of the MOS transistor N23 are shown in order from top.

When the input signal IN is switched from the low level to the high level, the MOS transistor P21 is turned on and the MOS transistor N21 is turned off in the pre-driver 21, and the output voltage Vgp of the pre-driver 21 transitions from the ground potential GND to the internal power supply voltage VE of the internal power supply circuit 20. Furthermore, the MOS transistor N22 is turned off by the output of the inverter IV.

The MOS transistor N23 is thus turned on to increase the gate voltage VG, the internal power supply voltage VE increases accordingly, and the output voltage Vgp increases to follow the internal power supply voltage VE. A gate-to-source voltage of the MOS transistor N23 thus increases, so that the output source current Ig of the MOS transistor N23 increases.

The gate voltage VG has the waveform that increases from zero volts, increases again after the mirror period, and eventually becomes constant at the voltage VCC. The mirror period corresponds to the period during which the gate-to-collector capacitance of the IGBT 1 is charged.

As described above, the semiconductor device drive circuit 200 outputs the gate voltage VG exhibiting the waveform that increases from zero volts and becomes constant at the voltage VCC after the mirror period, and the internal power supply circuit 20 is configured to receive the gate voltage VG, and change the current flowing therethrough in an analog fashion, so that the output voltage Vgp of the pre-driver 21 that operates between the internal power supply voltage VE of the internal power supply circuit 20 and the voltage VCC can be changed continuously as shown in FIG. 5.

Thus, as shown in FIG. 5, the output source current Ig can be increased in entering the mirror period compared with that at the start of switching, and the amount of current can be maintained during the mirror period. This is because the internal power supply voltage VE of the internal power supply circuit 20 increases with the increase of the gate voltage VG, and thus the gate-to-source voltage of the MOS transistor N23 increases.

The increase of the output source current Ig during the mirror period allows for acceleration of the gate charge rate of the IGBT 1 and shortening of the mirror period.

The collector-to-emitter decrease rate dV/dt of the IGBT 1 can thus become steep, and the switching losses can be improved.

Figure 6:
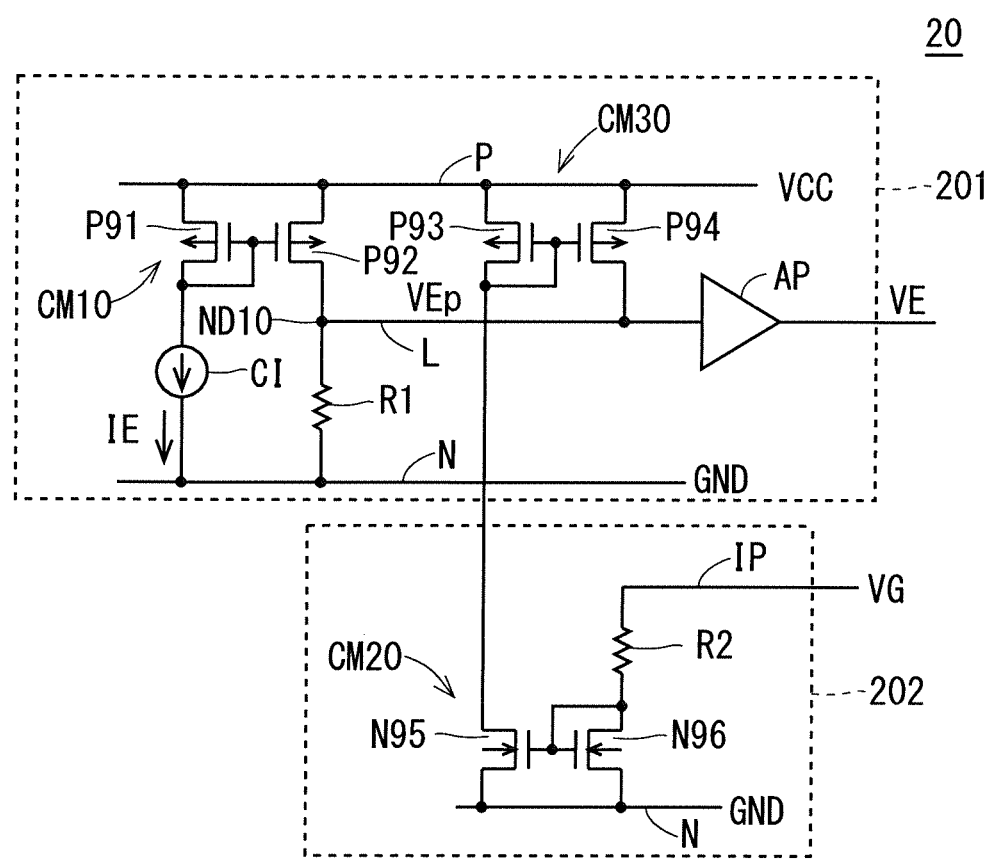
FIG. 6 is a circuit diagram showing one example of a configuration of an internal power supply circuit.

FIG. 6 is a circuit diagram showing one example of a configuration of the internal power supply circuit 20. As shown in FIG. 6, the internal power supply circuit 20 includes a current mirror circuit CM10 (the first current mirror circuit) including a primary side circuit in which a P-channel type MOS transistor P91 and the constant current source CI are connected in series between the power supply line P that provides the voltage VCC and the power supply line N that provides the ground potential GND and a secondary side circuit in which a P-channel type MOS transistor P92 and the resistive element R1 are connected in series between the power supply line P and the power supply line N. Gates of the MOS transistor P91 and the MOS transistor P92 are commonly connected to a drain of the MOS transistor P91. A node ND10 between the MOS transistor P92 and the resistive element R1 is connected to the input of the amplifier AP via the signal line L.

The internal power supply circuit 20 also includes a current mirror circuit CM30 (third current mirror circuit) including a primary side circuit including a MOS transistor P93 and a secondary side circuit including a P-channel type MOS transistor P94 connected between the power supply line P and the signal line L. Gates of the MOS transistor P93 and the MOS transistor P94 are commonly connected to a drain of the MOS transistor P93. The constant voltage generation unit 101 is configured by the above-mentioned circuits.

Furthermore, the P-channel type MOS transistor P93 and the N-channel type MOS transistor N95 are connected in series between the power supply line P and the power supply line N.

The internal power supply circuit 20 includes a current mirror circuit CM20 (second current mirror circuit) including a primary side circuit in which the resistive element R2 and the N-channel type MOS transistor N96 are connected between the input IP of the internal power supply circuit 20 and the power supply line N and a secondary side circuit including the MOS transistor N95. Gates of the MOS transistor N95 and the MOS transistor N96 are commonly connected to a drain of the MOS transistor N96. The feedback unit 202 is configured by the above-mentioned circuit.

The current mirror circuit CM10 allows the current depending on the current IE output from the constant current source CI to flow through the MOS transistor P92. The current flows through the resistive element R1 to generate the voltage VEp, and the internal power supply voltage VE is output by using the amplifier AP as the follower circuit.

The current mirror circuit CM20 allows the current depending on the value of the gate voltage VG input into the input IP to flow through the MOS transistor N95. When the gate voltage VG increases from zero, the current flowing through the resistive element R2 increases with the increase of the gate voltage VG, and a current flowing through the MOS transistor P94 of the current mirror circuit CM30 increases accordingly, so that the voltage VEp increases, and the internal power supply voltage VE output from the amplifier AP increases.

Embodiment 3

FIG. 7 is a circuit diagram showing a configuration of a semiconductor device drive circuit 300 in Embodiment 3 according to the present disclosure. As shown in FIG. 7, the semiconductor device drive circuit 300 is configured as the IC that drives the IGBT 1 as the power device. In FIG. 7, the same components as those of the semiconductor device drive circuit 100 described with reference to FIG. 1 bear the same reference signs as those of the same components, and redundant description will be omitted.

The collector of the IGBT 1 is connected to the main terminal MT that provides the main voltage VP via the freewheeling diode D1 and the inductor load L1 connected in parallel, and the emitter of the IGBT 1 is connected to the ground potential GND.

The semiconductor device drive circuit 300 includes a P-channel type MOS transistor P32 as the source side output transistor and a P-channel type MOS transistor P33 as the sink side output transistor connected in series between the power supply line P supplied with the voltage VCC from the power supply terminal OP and the ground potential GND.

The MOS transistors P32 and P33 operate complementarily, and a connection node ND0 between the MOS transistor P32 and the MOS transistor P33 serves as an output node ND0 of the semiconductor device drive circuit 300 from which the gate voltage VG is output and input into the gate of the IGBT 1.

An output voltage Vgn of a pre-driver 31 is input into a gate of the MOS transistor P33. The pre-driver 31 includes a P-channel type MOS transistor P31 and an N-channel type MOS transistor N31 connected in series between the power supply line P and the output line S of the internal power supply circuit 10.

The internal power supply circuit 10 is the circuit that operates between the voltage VCC and the ground potential GND, and receives the gate voltage VG and outputs the internal power supply voltage VE. A source of the MOS transistor N31 is connected to the output line S.

Gates of the MOS transistor P31 and the MOS transistor N31 are commonly connected to receive the output of the inverter IV. The inverter IV is supplied with the input signal IN, and the output of the inverter IV is also input into a gate of the MOS transistor P32.

Figure 8:
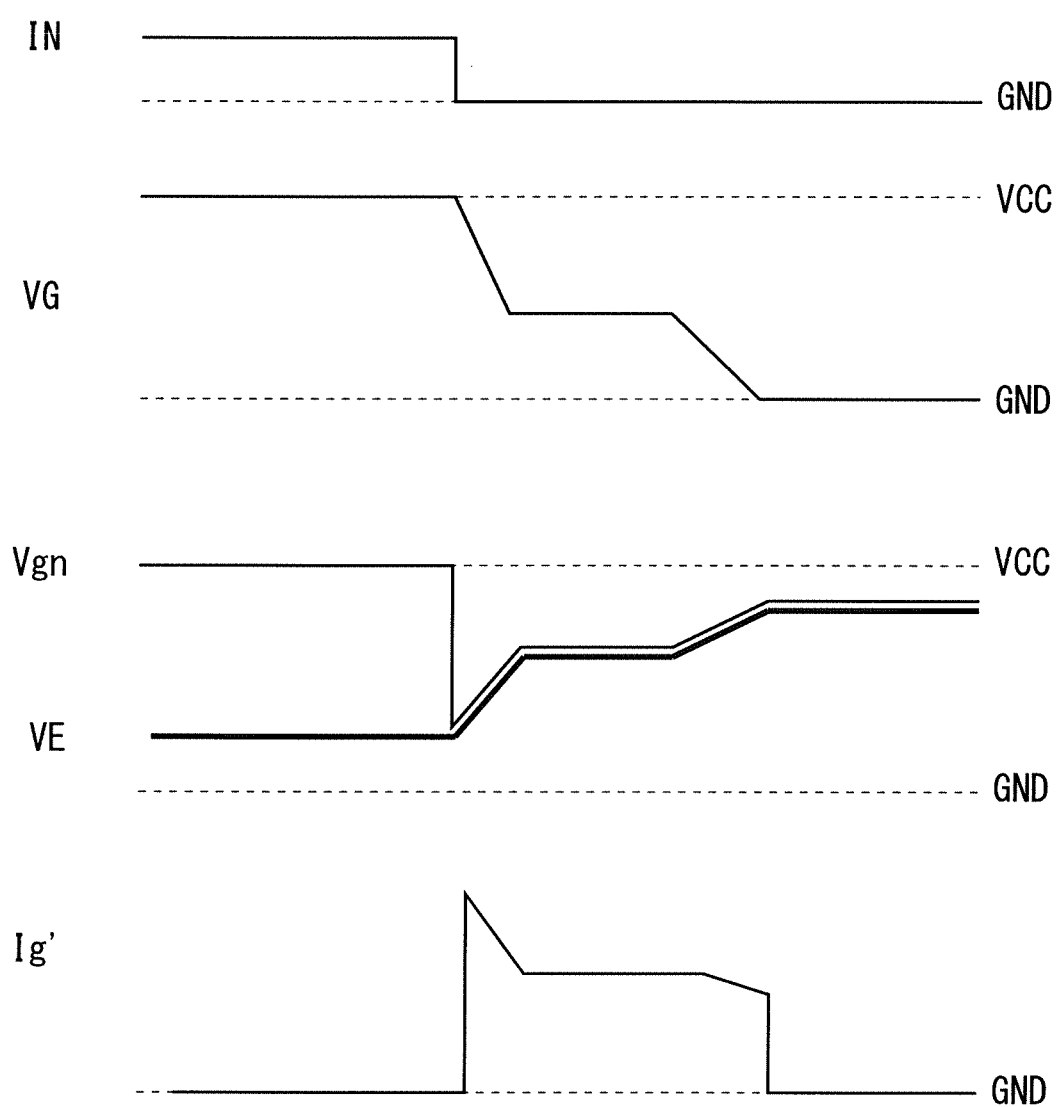
FIG. 8 is a diagram for describing operation of the semiconductor device drive circuit in Embodiment 3 according to the present disclosure.

FIG. 8 is a diagram showing a plurality of signal waveforms for describing operation of the semiconductor device drive circuit 300. In FIG. 8, a waveform diagram of the input signal IN, a waveform diagram of the gate voltage VG, a waveform diagram of the output voltage Vgn of the pre-driver 31, the waveform diagram of the internal power supply voltage VE of the internal power supply circuit 10, and a waveform diagram of an output sink current Ig' of the MOS transistor P33 are shown in order from top.

When the input signal IN is switched from the high level to the low level, an inverted signal thereof is input into the pre-driver 31, so that the MOS transistor P31 is turned off and the MOS transistor N31 is turned on in the pre-driver 31, and the output voltage Vgn of the pre-driver 31 transitions from the internal power supply voltage VE of the internal power supply circuit 10 to the voltage VCC. Furthermore, the MOS transistor P32 is turned off by the output of the inverter IV.

The MOS transistor P33 is thus turned on to decrease the gate voltage VG, the internal power supply voltage VE increases accordingly, and the output voltage Vgn increases to follow the internal power supply voltage VE. A gate-to-source voltage of the MOS transistor P33 thus decreases, so that the output sink current Ig' of the MOS transistor P33 decreases.

The gate voltage VG has a waveform that decreases from the voltage VCC, decreases again after the mirror period, and eventually becomes constant at the ground potential GND.

As described above, the semiconductor device drive circuit 300 outputs the gate voltage VG exhibiting the waveform that decreases from the voltage VCC and becomes constant at the ground potential GND after the mirror period, and the internal power supply circuit 10 is configured to receive the gate voltage VG, and change the current flowing therethrough in an analog fashion, so that the output voltage Vgn of the pre-driver 31 that operates between the internal power supply voltage VE of the internal power supply circuit 10 and the voltage VCC can be changed continuously as shown in FIG. 8.

Thus, as shown in FIG. 8, the output sink current Ig' can be decreased in entering the mirror period compared with that at the start of switching, and the amount of current can be maintained during the mirror period. A surge in a collector-to-emitter voltage Vce of the IGBT 1 can thus be suppressed, and the switching losses can be reduced.

<Modification>

Figure 9:
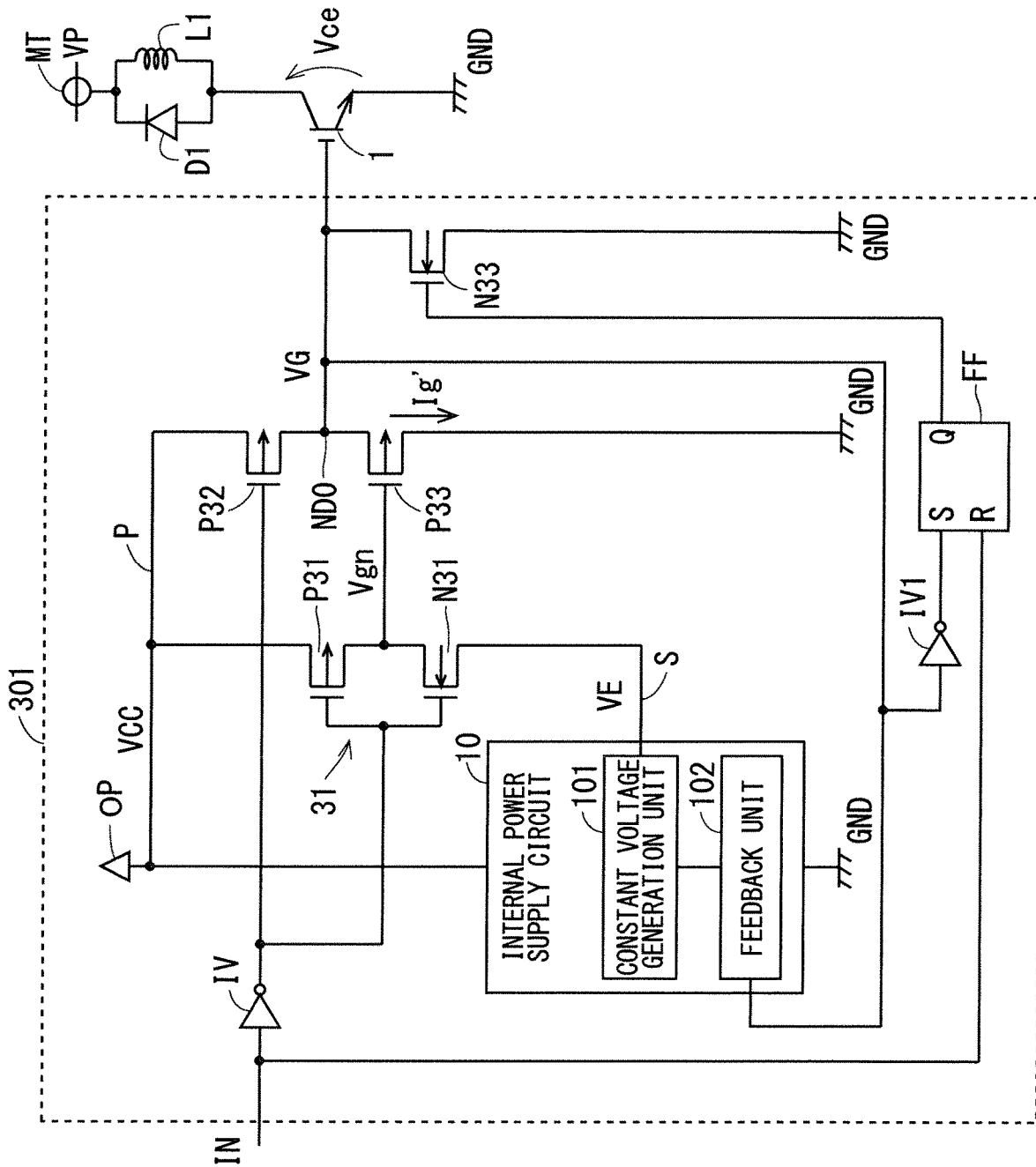
FIG. 9 is a circuit diagram showing a configuration of a modification of the semiconductor device drive circuit in Embodiment 3 according to the present disclosure.

FIG. 9 is a circuit diagram showing a configuration of a semiconductor device drive circuit 301 in a modification of Embodiment 3 according to the present disclosure. As shown in FIG. 9, the semiconductor device drive circuit 301 includes an N-channel type MOS transistor N33 connected between the output node ND0 and the ground potential GND in addition to the configuration of the semiconductor device drive circuit 300 shown in FIG. 7.

The MOS transistor N33 is the sink side output transistor, and a gate thereof is connected to a Q output of an SR flip-flop circuit FF. An inverted signal of the gate voltage VG is input into an S input of the SR flip-flop circuit FF via an inverter IV1, and the input signal IN is input into an R input of the SR flip-flop circuit FF. With a rise of the input signal IN as a trigger, the gate of the MOS transistor N33 is switched from a high level to a low level. A threshold of the inverter IV1 is herein set close to zero volts, so that the gate of the MOS transistor N33 is switched from the low level to the high level, and is turned on with a fall of the gate voltage VG close to zero volts as a trigger, that is, upon sensing of a value of the gate voltage VG close to zero volts. The voltage VE can thus be increased to the voltage VCC.

When the internal power supply voltage VE reaches close to the voltage VCC, the gate-to-source voltage of the MOS transistor P33 falls below a threshold of the MOS transistor P33, and the MOS transistor P33 is turned off, so that the output sink current Ig' of the MOS transistor P33 can further be decreased, and the surge in the collector-to-emitter voltage Vce of the IGBT 1 can further be suppressed. After the MOS transistor P33 is turned off, the gate voltage VG decreases, and the MOS transistor N33 is turned on, so that a lift of the gate voltage VG by driving of the IGBT 1 can be prevented.

Embodiment 4

Figure 10:
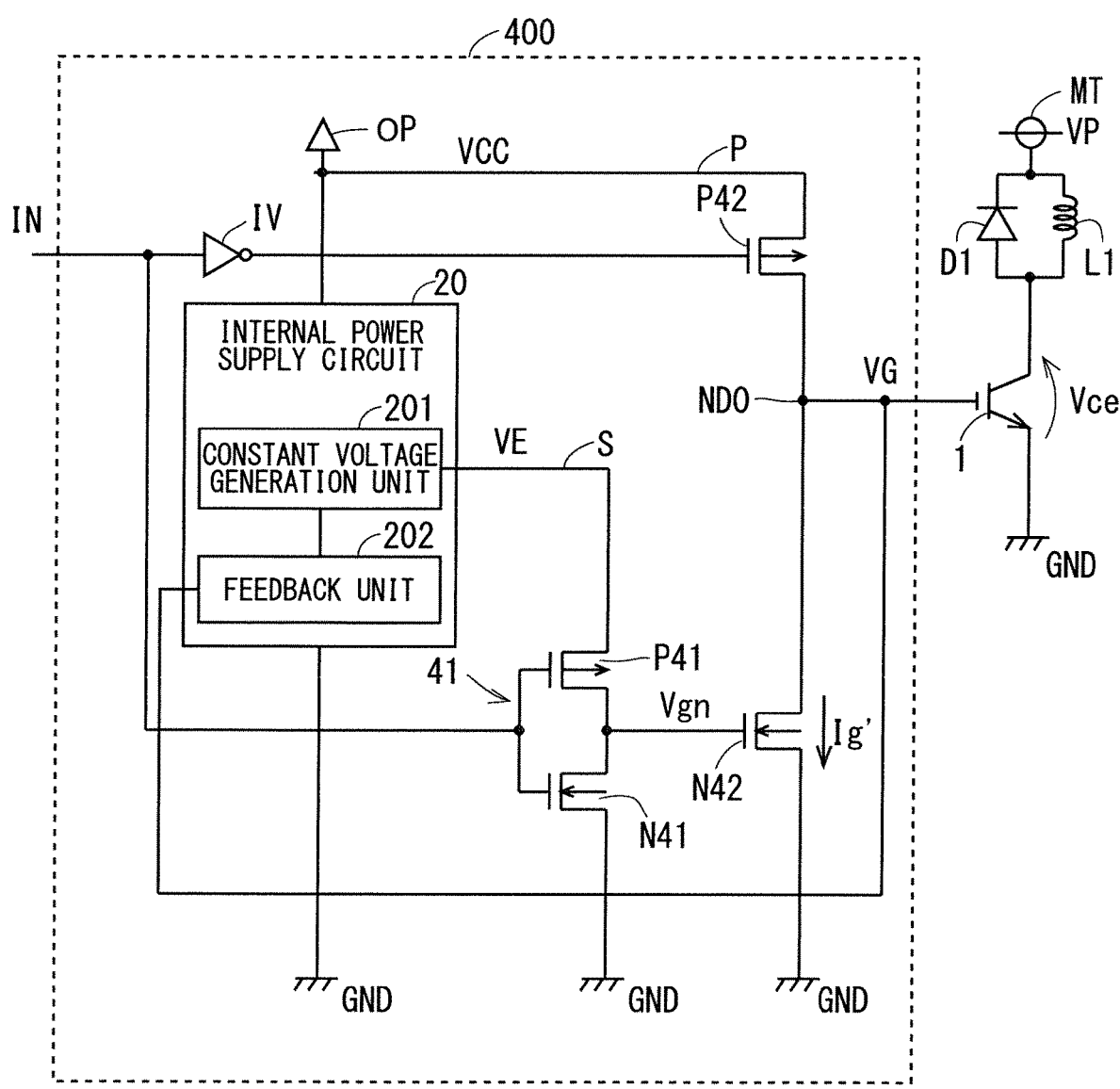
FIG. 10 is a circuit diagram showing a configuration of a semiconductor device drive circuit in Embodiment 4 according to the present disclosure.

FIG. 10 is a circuit diagram showing a configuration of a semiconductor device drive circuit 400 in Embodiment 4 according to the present disclosure. As shown in FIG. 10, the semiconductor device drive circuit 400 is configured as the IC that drives the IGBT 1 as the power device. In FIG. 10, the same components as those of the semiconductor device drive circuit 200 described with reference to FIG. 7 bear the same reference signs as those of the same components, and redundant description will be omitted.

The collector of the IGBT 1 is connected to the main terminal MT that provides the main voltage VP via the freewheeling diode D1 and the inductor load L1 connected in parallel, and the emitter of the IGBT 1 is connected to the ground potential GND.

The semiconductor device drive circuit 400 includes a P-channel type MOS transistor P42 as the source side output transistor and an N-channel type MOS transistor N42 as the sink side output transistor connected in series between the power supply line P supplied with the voltage VCC from the power supply terminal OP and the ground potential GND.

The MOS transistors P42 and N42 operate complementarily, and a connection node ND0 between the MOS transistor P42 and the MOS transistor N42 serves as an output node ND0 of the semiconductor device drive circuit 400 from which the gate voltage VG is output and input into the gate of the IGBT 1.

An output voltage Vgn of a pre-driver 41 is input into a gate of the MOS transistor N42. The pre-driver 41 includes a P-channel type MOS transistor P41 and an N-channel type MOS transistor N41 connected in series between the output line S of the internal power supply circuit 20 and the ground potential GND.

The internal power supply circuit 20 is the circuit that operates between the voltage VCC and the ground potential GND, and receives the gate voltage VG and outputs the internal power supply voltage VE. A source of the MOS transistor P41 is connected to the output line S.

Gates of the MOS transistor P41 and the MOS transistor N41 are commonly connected, and supplied with the input signal IN. The inverter IV is supplied with the input signal IN, and the output of the inverter IV is input into a gate of the MOS transistor P42.

Figure 11:
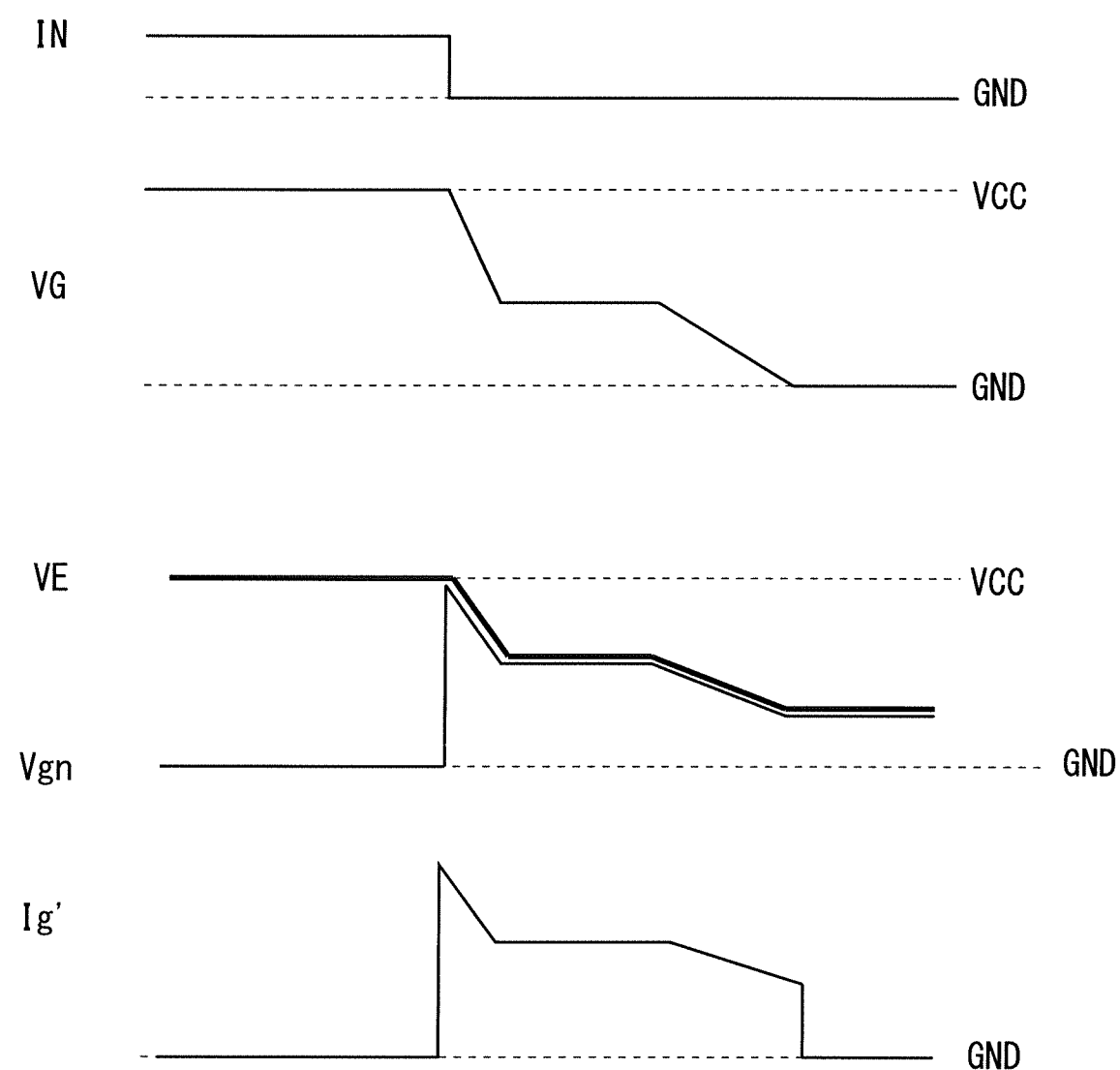
FIG. 11 is a diagram for describing operation of the semiconductor device drive circuit in Embodiment 4 according to the present disclosure.

FIG. 11 is a diagram showing a plurality of signal waveforms for describing operation of the semiconductor device drive circuit 400. In FIG. 11, the waveform diagram of the input signal IN, the waveform diagram of the gate voltage VG, the waveform diagram of the internal power supply voltage VE of the internal power supply circuit 20, a waveform diagram of the output voltage Vgn of the pre-driver 41, and a waveform diagram of an output sink current Ig' of the MOS transistor N42 are shown in order from top.

When the input signal IN is switched from the high level to the low level, the MOS transistor P41 is turned on and the MOS transistor N41 is turned off in the pre-driver 41, and the output voltage Vgn of the pre-driver 41 transitions from the internal power supply voltage VE of the internal power supply circuit 20 to the ground potential GND. Furthermore, the MOS transistor P42 is turned off by the output of the inverter IV.

The MOS transistor N42 is thus turned on to decrease the gate voltage VG, the internal power supply voltage VE decreases accordingly, and the output voltage Vgn decreases to follow the internal power supply voltage VE. A gate-to-source voltage of the MOS transistor N42 thus decreases, so that the output sink current Ig' of the MOS transistor N42 decreases.

The gate voltage VG has a waveform that decreases from the voltage VCC, decreases again after the mirror period, and eventually becomes constant at the ground potential GND.

As described above, the semiconductor device drive circuit 400 outputs the gate voltage VG exhibiting the waveform that decreases from the voltage VCC and becomes constant at the ground potential GND after the mirror period, and the internal power supply circuit 20 is configured to receive the gate voltage VG, and change the current flowing therethrough in an analog fashion, so that the output voltage Vgn of the pre-driver 41 that operates between the internal power supply voltage VE of the internal power supply circuit 20 and the voltage VCC can be changed continuously as shown in FIG. 11.

Thus, as shown in FIG. 11, the output sink current Ig' can be decreased in entering the mirror period compared with that at the start of switching, and the amount of current can be maintained during the mirror period. As shown in FIG. 11, the surge in the collector-to-emitter voltage Vce of the IGBT 1 can thus be suppressed, and the switching losses can be reduced.

<Modification>

Figure 12:
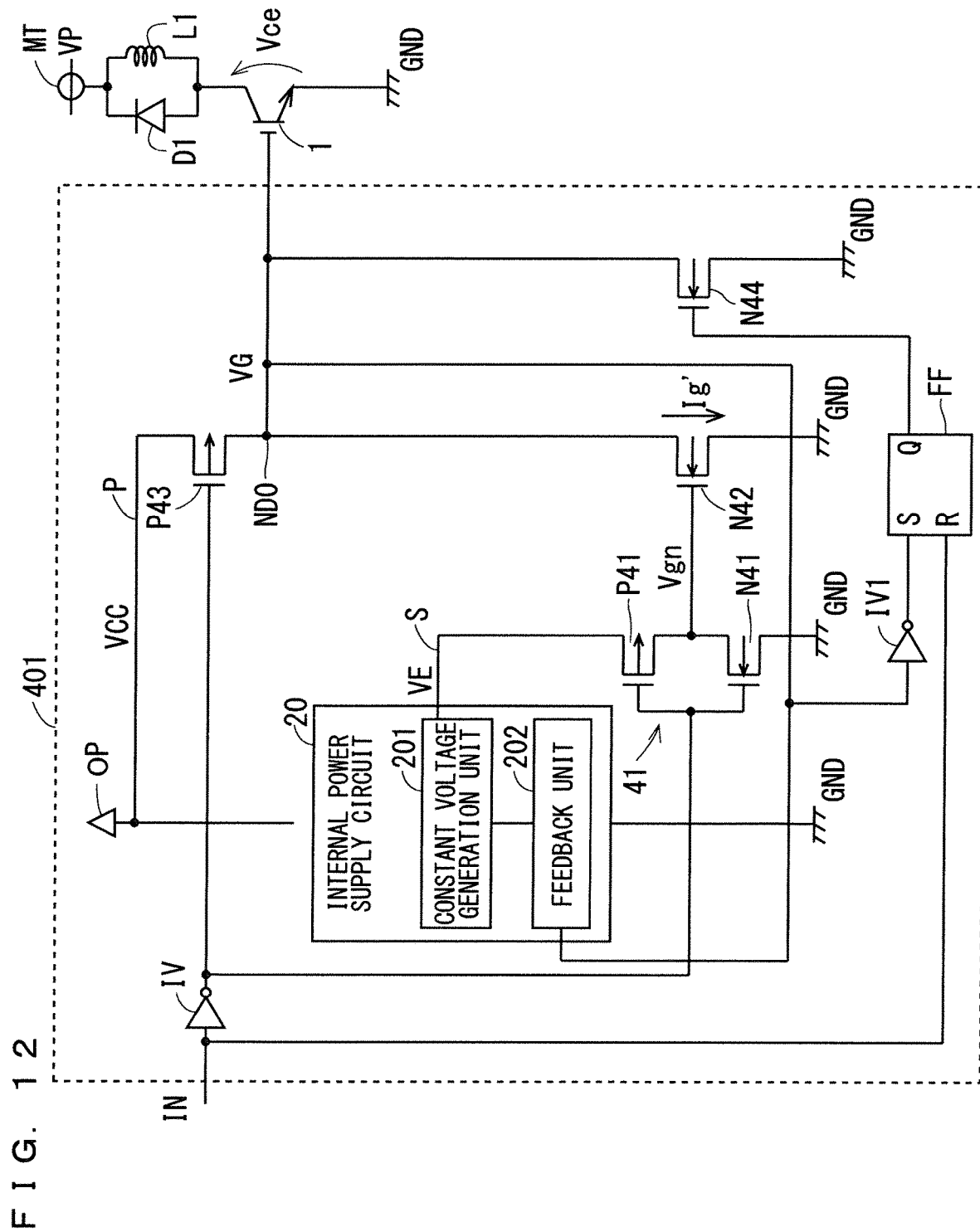
FIG. 12 is a circuit diagram showing a configuration of a modification of the semiconductor device drive circuit in Embodiment 4 according to the present disclosure.

FIG. 12 is a circuit diagram showing a configuration of a semiconductor device drive circuit 401 in a modification of Embodiment 4 according to the present disclosure. As shown in FIG. 12, the semiconductor device drive circuit 401 includes an N-channel type MOS transistor N44 connected between the output node ND0 and the ground potential GND in addition to the configuration of the semiconductor device drive circuit 400 shown in FIG. 10.

The MOS transistor N44 is the sink side output transistor, and a gate thereof is connected to the Q output of the SR flip-flop circuit FF. The inverted signal of the gate voltage VG is input into the S input of the SR flip-flop circuit FF via the inverter IV1, and the input signal IN is input into the R input of the SR flip-flop circuit FF. With the rise of the input signal IN as the trigger, the gate of the MOS transistor N44 is switched from a high level to a low level. A threshold of the inverter IV1 is herein set close to zero volts, so that the gate of the MOS transistor N44 is switched from the low level to the high level, and is turned on with the fall of the gate voltage VG close to zero volts as the trigger, that is, upon sensing of the value of the gate voltage VG close to zero volts. The internal power supply voltage VE can thus be decreased to the ground potential GND.

When the internal power supply voltage VE reaches close to the ground potential GND, the gate-to-source voltage of the MOS transistor N42 falls below a threshold of the MOS transistor N42, and the MOS transistor N42 is turned off, so that the output sink current Ig' of the MOS transistor N42 can further be decreased, and the surge in the collector-to-emitter voltage Vce of the IGBT 1 can further be suppressed. After the MOS transistor N42 is turned off, the gate voltage VG decreases, and the MOS transistor N44 is turned on, so that the lift of the gate voltage VG by driving of the IGBT 1 can be prevented.

<Other Applications>

While the semiconductor device drive circuits in Embodiments 1 to 4 are each described as a drive circuit for the IGBT 1, this is one example of applications of the present disclosure, and the semiconductor device drive circuit is not limited to the drive circuit for the IGBT 1.

For example, the semiconductor device drive circuit is applicable to a drive circuit for each of two power switching devices combined to constitute a half bridge output circuit, and is applicable to a drive circuit for each of four power switching devices combined to constitute a full bridge output circuit. The semiconductor device drive circuit is also applicable to a drive circuit for each of six power switching devices combined to constitute a three-phase inverter circuit.

The semiconductor device drive circuit is also applicable to a drive circuit for a power switching device of a system that controls an inductive load, such as a motor, in any of the half bridge output circuit, the full bridge output circuit, and the three-phase inverter circuit.

While an IGBT is taken as an example of a power switching device as a control target, the power switching device is not limited to the IGBT, and a metal oxide semiconductor field effect transistor (MOSFET) can be the control target.

Embodiments can freely be combined with each other, and can be modified or omitted as appropriate within the scope of the present disclosure.

The present disclosure described above will collectively be described as appendices.

(Appendix 1)

A semiconductor device drive circuit that drives a power switching device, the semiconductor device drive circuit including:
  a first transistor and a second transistor that are connected in series and operate complementarily between a first voltage and a second voltage lower than the first voltage;
  an internal power supply circuit that operates between the first voltage and the second voltage, and includes: a constant voltage generation unit that outputs an internal power supply voltage steadily being a constant voltage; and a feedback unit that receives a node voltage of a connection node between the first transistor and the second transistor, and changes the internal power supply voltage output from the constant voltage generation unit in response to a change of the node voltage; and
  a pre-driver that operates between the first voltage and the internal power supply voltage, and drives the first transistor or the second transistor, wherein
  the node voltage is output as a gate voltage of the power switching device.

(Appendix 2)

The semiconductor device drive circuit according to Appendix 1, wherein
  the first transistor is a P-channel type MOS transistor,
  the pre-driver drives the P-channel type MOS transistor, and
  the internal power supply circuit decreases the internal power supply voltage in response to an increase of the gate voltage.

(Appendix 3)

The semiconductor device drive circuit according to Appendix 1, wherein
  the second transistor is a P-channel type MOS transistor,
  the pre-driver drives the P-channel type MOS transistor, and
  the internal power supply circuit increases the internal power supply voltage in response to a decrease of the gate voltage.

(Appendix 4)

A semiconductor device drive circuit that drives a power switching device, the semiconductor device drive circuit including:
  a first transistor and a second transistor that are connected in series and operate complementarily between a first voltage and a second voltage lower than the first voltage;
  an internal power supply circuit that operates between the first voltage and the second voltage, and includes: a constant voltage generation unit that outputs an internal power supply voltage steadily being a constant voltage; and a feedback unit that receives a node voltage of a connection node between the first transistor and the second transistor, and changes the internal power supply voltage output from the constant voltage generation unit in response to a change of the node voltage; and
  a pre-driver that operates between the internal power supply voltage and the second voltage, and drives the first transistor or the second transistor, wherein
  the node voltage is output as a gate voltage of the power switching device.

(Appendix 5)

The semiconductor device drive circuit according to Appendix 4, wherein
  the first transistor is an N-channel type MOS transistor,
  the pre-driver drives the N-channel type MOS transistor, and
  the internal power supply circuit increases the internal power supply voltage in response to an increase of the gate voltage.

(Appendix 6)

The semiconductor device drive circuit according to Appendix 4, wherein
  the second transistor is an N-channel type MOS transistor,
  the pre-driver drives the N-channel type MOS transistor, and
  the internal power supply circuit decreases the internal power supply voltage in response to a decrease of the gate voltage.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device drive circuit that drives a power switching device, the semiconductor device drive circuit comprising:
  a first transistor and a second transistor that are connected in series and operate complementarily between a first voltage and a second voltage lower than the first voltage;
  an internal power supply circuit that operates between the first voltage and the second voltage, and includes: a constant voltage generation unit that outputs an internal power supply voltage steadily being a constant voltage; and a feedback unit that receives a node voltage of a connection node between the first transistor and the second transistor, and changes the internal power supply voltage output from the constant voltage generation unit in response to a change of the node voltage; and a pre-driver that operates between the first voltage and the internal power supply voltage, and drives the first transistor or the second transistor, wherein the node voltage is output as a gate voltage of the power switching device.

2. The semiconductor device drive circuit according to claim 1, wherein the first transistor is a P-channel type MOS transistor, the pre-driver drives the P-channel type MOS transistor, and the internal power supply circuit decreases the internal power supply voltage in response to an increase of the gate voltage.

3. The semiconductor device drive circuit according to claim 1, wherein the second transistor is a P-channel type MOS transistor, the pre-driver drives the P-channel type MOS transistor, and the internal power supply circuit increases the internal power supply voltage in response to a decrease of the gate voltage.

4. A semiconductor device drive circuit that drives a power switching device, the semiconductor device drive circuit comprising:

a first transistor and a second transistor that are connected in series and operate complementarily between a first voltage and a second voltage lower than the first voltage;

an internal power supply circuit that operates between the first voltage and the second voltage, and includes: a constant voltage generation unit that outputs an internal power supply voltage steadily being a constant voltage; and a feedback unit that receives a node voltage of a connection node between the first transistor and the second transistor, and changes the internal power supply voltage output from the constant voltage generation unit in response to a change of the node voltage; and a pre-driver that operates between the internal power supply voltage and the second voltage, and drives the first transistor or the second transistor, wherein the node voltage is output as a gate voltage of the power switching device.

5. The semiconductor device drive circuit according to claim 4, wherein the first transistor is an N-channel type MOS transistor, the pre-driver drives the N-channel type MOS transistor, and the internal power supply circuit increases the internal power supply voltage in response to an increase of the gate voltage.

6. The semiconductor device drive circuit according to claim 4, wherein the second transistor is an N-channel type MOS transistor, the pre-driver drives the N-channel type MOS transistor, and the internal power supply circuit decreases the internal power supply voltage in response to a decrease of the gate voltage.

\* \* \* \* \*